(12) United States Patent
Verrier et al.

(10) Patent No.: US 7,321,299 B2
(45) Date of Patent: Jan. 22, 2008

(54) WORKPIECE HANDLING ALIGNMENT SYSTEM

(75) Inventors: Kevin R. Verrier, Hampton, NH (US); David K. Bernhardt, Hudson, MA (US); Jerry F. Negrotti, Beverly, MA (US); Donald N. Polner, Marblehead, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 336 days.

(21) Appl. No.: 11/147,973

(22) Filed: Jun. 8, 2005

(65) Prior Publication Data

US 2007/0008105 A1   Jan. 11, 2007

(51) Int. Cl.
*G08B 19/00* (2006.01)
(52) U.S. Cl. ............ 340/521; 340/679; 340/680; 340/686.1; 340/686.2; 340/686.4; 340/686.5
(58) Field of Classification Search .......... 340/521, 340/506, 679, 680, 686.1, 686.2, 686.4, 686.6, 340/686.5; 700/218, 229, 190, 217
See application file for complete search history.

(56) References Cited

U.S. PATENT DOCUMENTS 6,763,281 B2 * 7/2004 Schauer et al. ......... 700/218
7,158,857 B2 * 1/2007 Schauer et al. ......... 700/218

* cited by examiner

*Primary Examiner*—Daryl C Pope
(74) *Attorney, Agent, or Firm*—Tarolli, Sundheim, Covell & Tummino LLP

(57) ABSTRACT

Method and apparatus for use in setting up workpiece treatment or processing equipment. A disclosed system processes silicon wafers that are treated during processing steps in producing semiconductor integrated circuits. The processing equipment includes a wafer support that supports a wafer in a treatment region during wafer processing. A housing provides a controlled environment within the housing interior for processing the wafer on the wafer support. A mechanical transfer system transports wafers to and from the support. A wafer simulator is used to simulate wafer movement and includes a pressure sensor for monitoring contact between the simulator and the wafer transfer and support equipment. In one illustrated embodiment the wafer simulator is generally circular and includes three equally spaced pressure sensors for monitoring contact with wafer transport and support equipment.

29 Claims, 6 Drawing Sheets

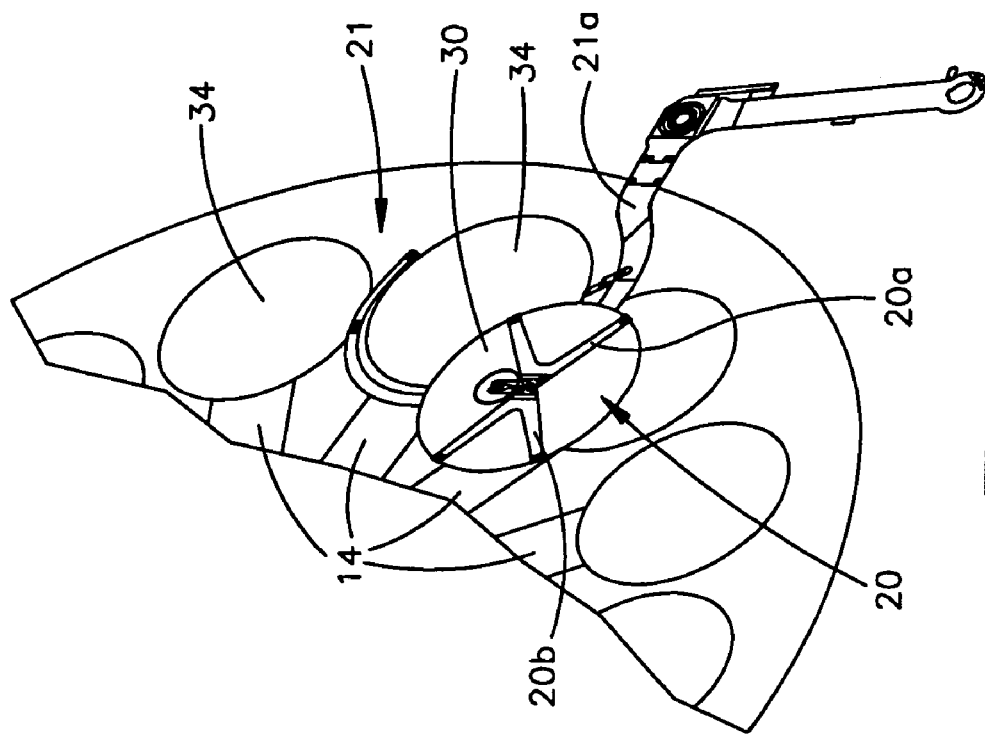
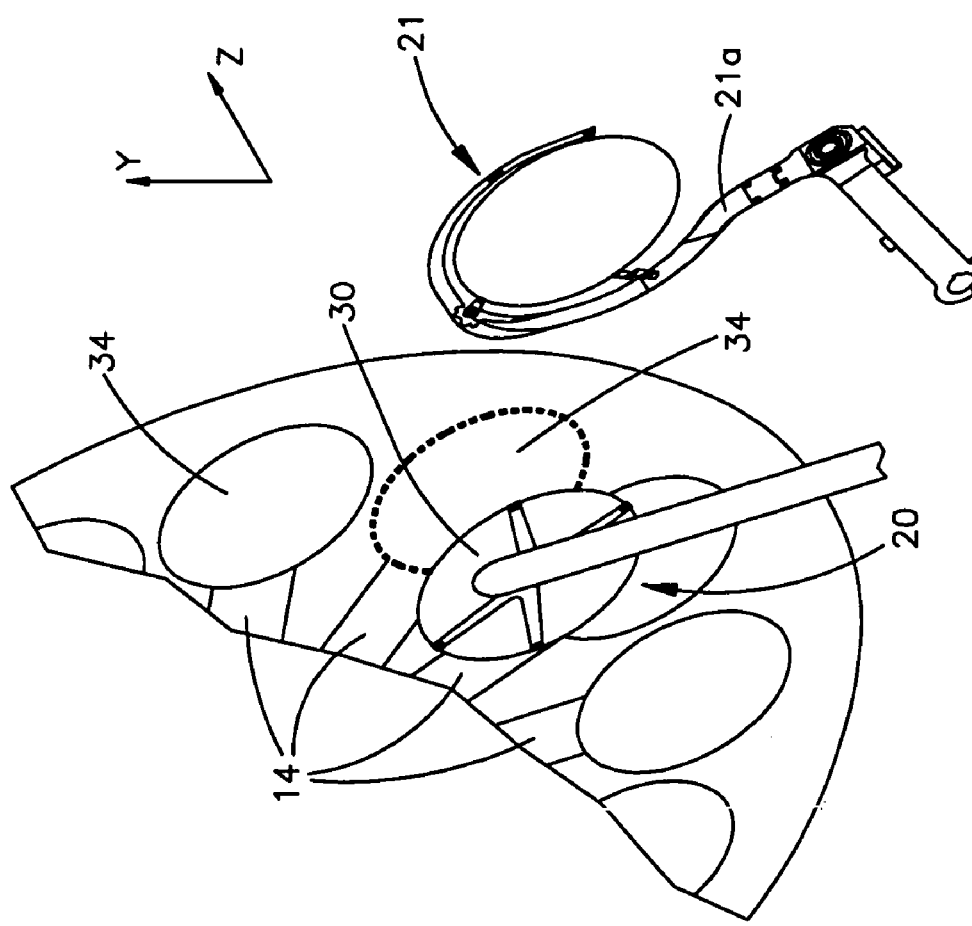

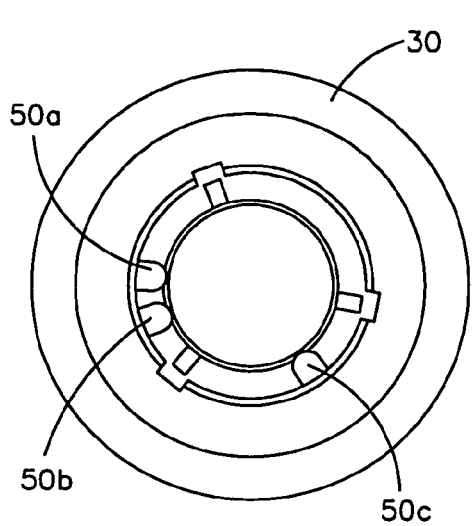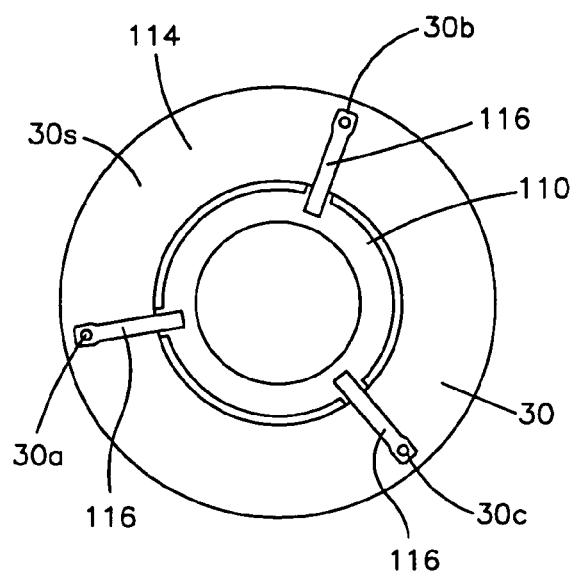
Fig.3A  Fig.3B
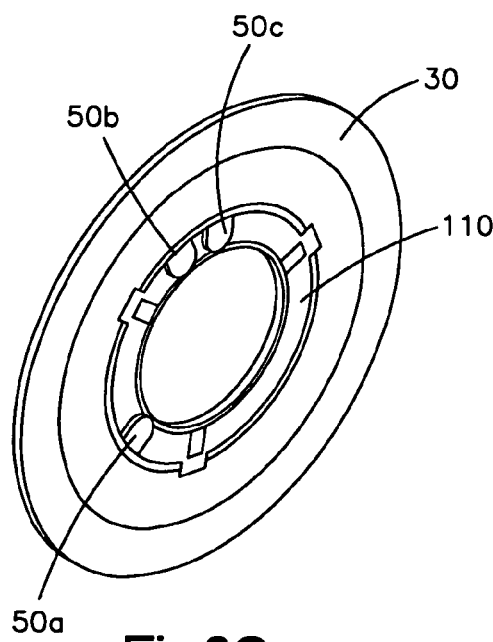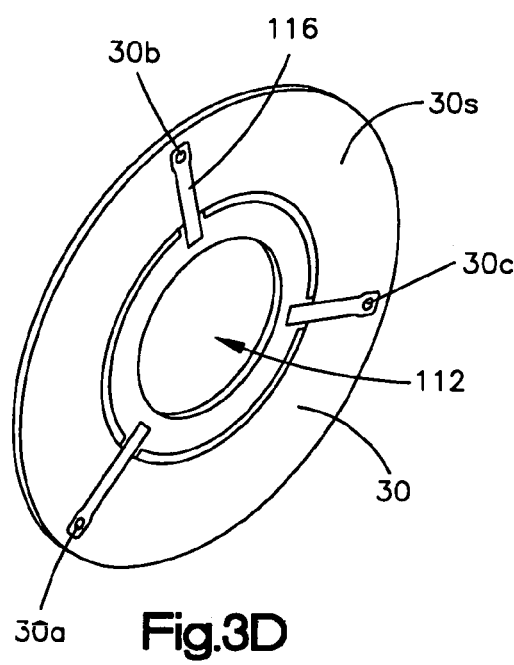
Fig.3C  Fig.3D

WORKPIECE HANDLING ALIGNMENT SYSTEM

FIELD OF THE INVENTION

The present invention concerns an alignment system for use in set up and calibration of a tool used for automatic manipulation of a workpiece such as a silicon wafer treatment or processing system.

BACKGROUND ART

During the manufacture of integrated circuits from silicon wafers, the wafers are treated and processed in multiple co-ordinated steps. These steps are performed in sequence at different locations in a fabrication facility that includes a variety of different wafer processing equipment. One known processing step is the heating of a partially fabricated integrated circuit in the presence of a controlled environment to process a wafer. Another such process is the positioning of a wafer within an ion beam for beam treatment of the wafer to selectively dope regions of the wafer. Apparatus for curing silicon wafers and stripping away photoresist are also other known automation tools used in fabricating integrated circuits. These processes are performed without human contact with the wafers. Mechanical devices lift, rotate, transport and gently place the wafers during these multiple co-ordinated processing procedures.

Proper set up of silicon wafer handling devices is important to minimize introduction of contaminants and avoiding damage to wafers due to inadvertent dropping, sliding or scraping of the wafers. Such set up can be difficult to perform when the wafer is located in a vacuum. Visibility and access to obtain physical measurements are limited. As a result, set up may be performed using nothing more sophisticated than a trained eye to look for slight movement, gaps and the like. Such set up is very subjective and inconsistent since there is no clear acceptable range or means to measure this range if it could be defined.

Set up of devices can be affect by exposure to vacuum, making bench set up of fixtures less useful. If the set up is performed without exposure of the treatment chamber to vacuum, then the application of a vacuum after setup can cause the equipment to become misaligned. The vacuum chamber walls move as vacuum is being applied. This can result in a previously aligned fixture becoming out of align as the walls of the chamber move. Bench fixtures that do exist are generic and do not compensate for any part specific tolerances or manufacturing variances. Periodic inspection of the wafer handling devices also needs to occur. A means to verify alignment without requiring venting of the tool (for installation/removal of a test fixture) is a desirable goal to minimize down time and ill effects causes by venting to atmosphere of the workpiece treatment chamber.

SUMMARY

The present disclosure concerns a test workpiece or workpiece simulator having monitoring apparatus for confirming proper workpiece transport and support setup. One preferred application is for equipment that operates at reduced pressure and the workpiece simulator can be used in set up and calibration without resort to venting of a workpiece treatment chamber.

An exemplary workpiece simulator includes a generally planar substrate including one or more sensors mounted on the substrate. Circuitry electrically coupled to the one or more sensors monitors signals from those sensors. Indicators coupled to the circuitry provides an output indication based on alignment indications from the one or more sensors during movement and positioning of the wafer simulator.

In the exemplary embodiment the indicators are visual indicators which are visible from outside an evacuated chamber in which the workpiece transport and support equipment is located. In an exemplary embodiment, the sensors are used to sense force or pressure exerted against the workpiece simulator. In other applications the sensors could be used to measure distance, displacement, capacitance or frequency.

One specific application of the disclosed workpiece simulator is in simulating movement and positioning of a silicon wafer. In this instance the workpiece takes the form of a thin generally circular disk having circuitry for generating a visual indication based on the output of pressure sensors located at different positions about the outer periphery of the disk.

These and other features of the exemplary embodiment are described in conjunction with the accompanying drawings.

BRIEF DESCRIPTION OF THE DRAWINGS

FIGS. 1A and 1B are enlarged depictions of wafer handling components within the chamber of FIG. 1;

FIGS. 3A-3D are depictions of a test wafer constructed in accordance with the present invention.

EXEMPLARY EMBODIMENT FOR PRACTICING THE INVENTION

Figure 1:
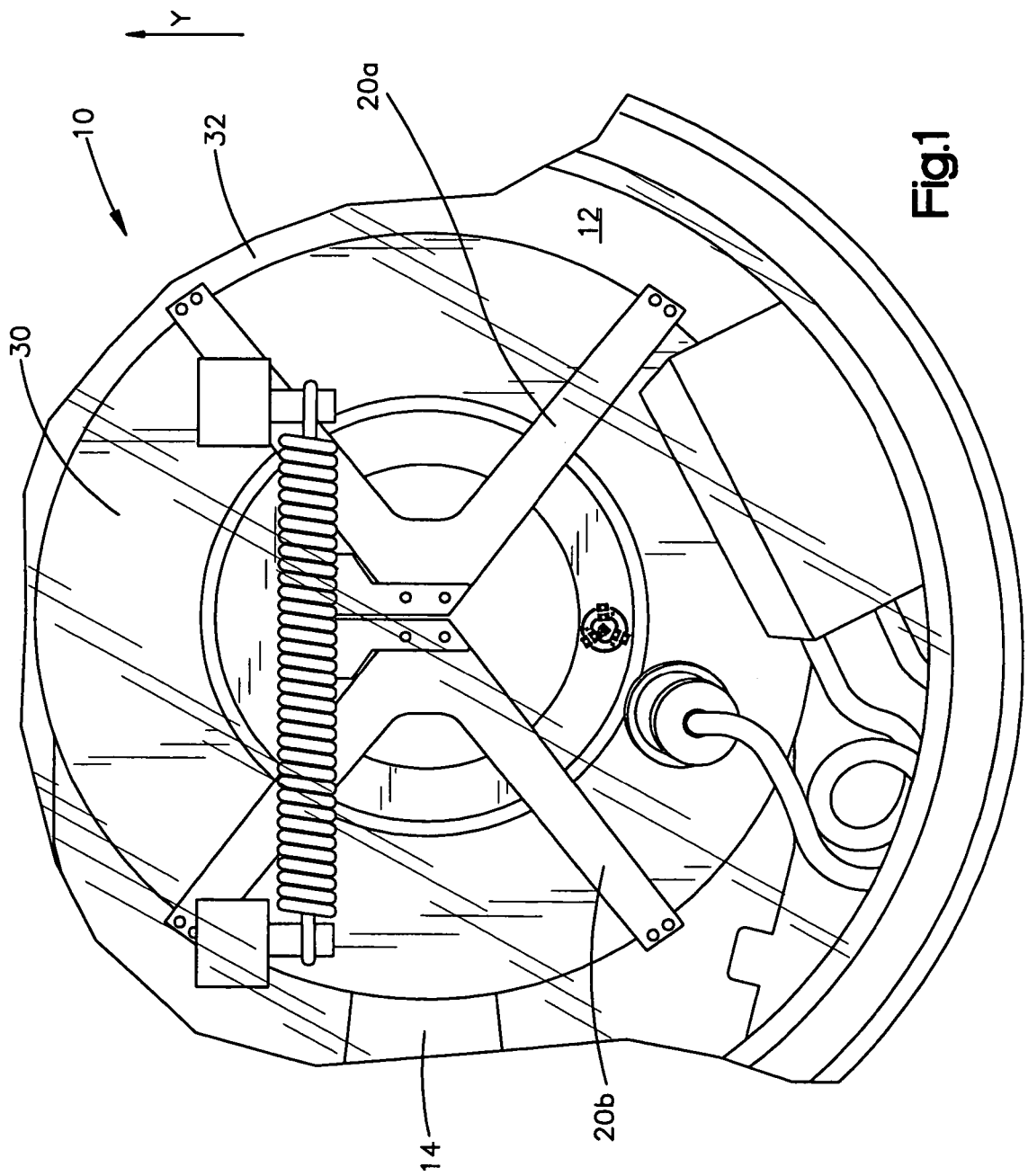
FIG. 1 is a depiction of an evacuated chamber as seen from outside the chamber and shows a test wafer constructed in accordance with the invention that is monitored from outside the chamber.

The drawings illustrate apparatus for calibrating wafer handling equipment for use with a wafer treatment system 10. One such system is an ion implanter for use in treating silicon wafers mounted within an evacuated ion implantation chamber 12 (FIGS. 1 and 1A). A wafer support having radially extending arms 14 within the chamber positions silicon wafers in a treatment region during wafer processing. In one embodiment the wafers are selectively doped with impurities that bombard a surface of the wafer by an ion beam that enters the chamber. This is one of a number of applications where wafers are transported by mechanical systems and alignment of those systems is important during wafer treatment.

The FIG. 1 chamber 12 provides a controlled environment within a housing interior for processing one or more wafers on the wafer support 14. Transfer structure for moving a wafer within the housing includes wafer holders 20, 21 that grasp edges of the wafer and move the wafer about inside the chamber 12. A load lock (not shown) delivers the wafers from a region of atmospheric pressure to a region within the chamber 12 of sub-atmospheric pressure where the wafers are treated. Typically commercially available ion implanters either move one wafer at a time through the ion beam for treatment or move batches through the ion beam. The exemplary embodiment is for use in checking alignment of the wafer support and wafer holders by means of a generally circular test wafer 30 having a number of sensors 30a, 30b, 30c mounted to the outer periphery of the test wafer. These sensors provide information regarding alignment of the pseudo wafer or wafer simulator 30 and more particularly the exemplary embodiment of the invention the wafer is visible through a window 32 in the chamber that allows the pseudo wafer 30 to be monitored during movement through the implantation chamber.

The fixture is clamped by boomerang shaped arms 20a, 20b of the wafer holder 20 and moved toward a disk support pad 34 (an exemplary embodiment includes 13 wafer support pads that spin around a center axis during implantation). The fixture determines if the wafer holder is parallel to the disk. The wafer holder is adjusted until it is parallel to the disk. The wafer holder's intended purpose is to remove wafers from the disk following an implant and deliver wafers to the second wafer holder 21.

The wafer simulator 30 is clamped (held) by an in-vac wafer holder 21 having a shepherds crook 21a that moves toward the wafer support. The wafer simulator 30 helps determine if the in-vac wafer holder 21 is parallel to the disk support pad 34. The in-vac arm is adjusted until it is parallel to the disk pad 34. The intended purpose of the in-vac wafer holder 21 is to place wafers onto the disk in preparation for implant.

In the exemplary embodiment, a visual indication regarding alignment is monitored through the window 32 but in other embodiments the signal could be another wireless signal such use of a radio transmitter and receiver combination that would not require visible monitoring of the chamber interior. The exemplary embodiment senses a pressure by monitoring a force against a uniform dimension force sensing pad. Other possible parameters for sensing are displacement of a sensor in relation to a target.

An exemplary wafer support 12 is depicted in U.S. Pat. No. 6,222,196 to Mack which is assigned to the assignee of the present application and incorporated herein by reference. This patent discloses a rotatable support having radially extending wafer support arms which support pads at their outer periphery. Contact between the support pads of the wafer support 12 and the wafer 30 can be monitored by the exemplary embodiment of the invention.

The exemplary wafer simulator is not a silicon wafer but instead is a silicon wafer simulating substrate having dimensions that approximate silicon wafers. The use of a wafer simulator allows alignment of different wafer handling equipment to be set up and monitored as the wafer simulator moves in the evacuated or pumped down environment of the wafer processing equipment.

Figure 2:
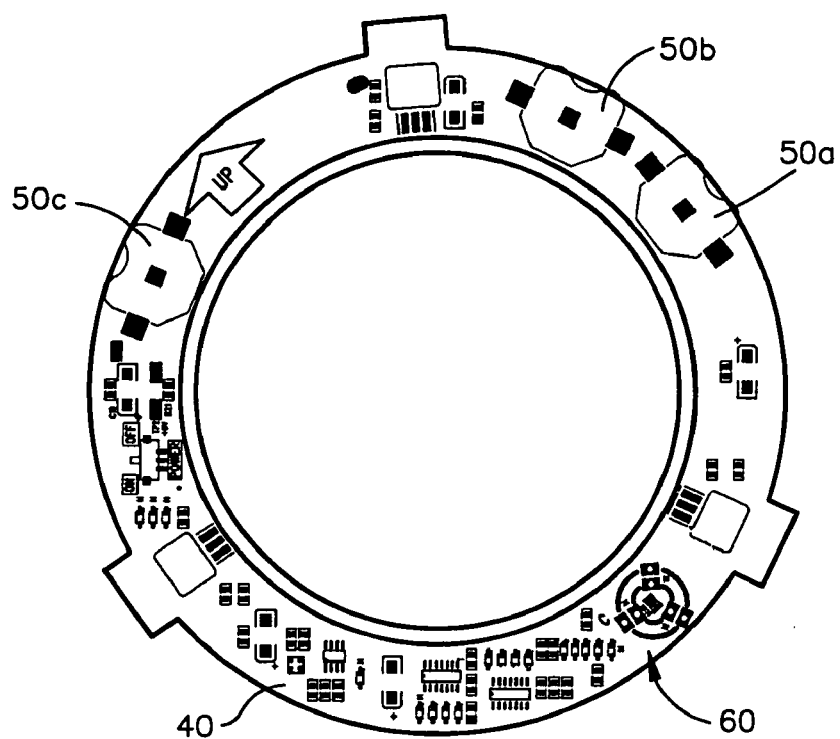
FIG. 2 is a portion of a test wafer showing a circuit board for monitoring an engagement with wafer handling equipment.

An exemplary test wafer 30 includes three pressure sensors 30a, 30b, 30c for monitoring contact between a substrate and wafer handling or support structure. The substrate also supports a circuit 40 (FIG. 2) for sensing an output from the pressure sensor 30a, 30b, 30c. A battery 50 energizes the circuit 40 as the substrate is moved by the wafer treatment system 10. An indicator array 60 of the circuit 40 produces an output based on the pressure sensed by the sensors 30a, 30b, 30c provides a visual output regarding the sensed alignment of the substrate and by way of example the window 32 allows the output from the indicator region 60 to be sensed from outside the chamber.

A three point contact between the wafer simulator 30 and a surface 12a which the wafer comes in contact works better in monitoring alignment than one alternative which would be a four point contact sensing wafer. An analogy between a four legged stool and a three legged stool is illustrative. The force against the four legged stool legs and the floor is never uniformly distributed amongst the four legs. The force exerted against the legs of a three legged stool is a better indication of levelness of the floor. Unevenness in floor surfaces results in an inequality of force which can be discerned if the stool legs are the same length. In the present circumstance, if the wafer simulator 30 is flat, misalignment of surfaces or structure with which the wafer comes in contact will be detected and realignment made easier.

Figure 4A:
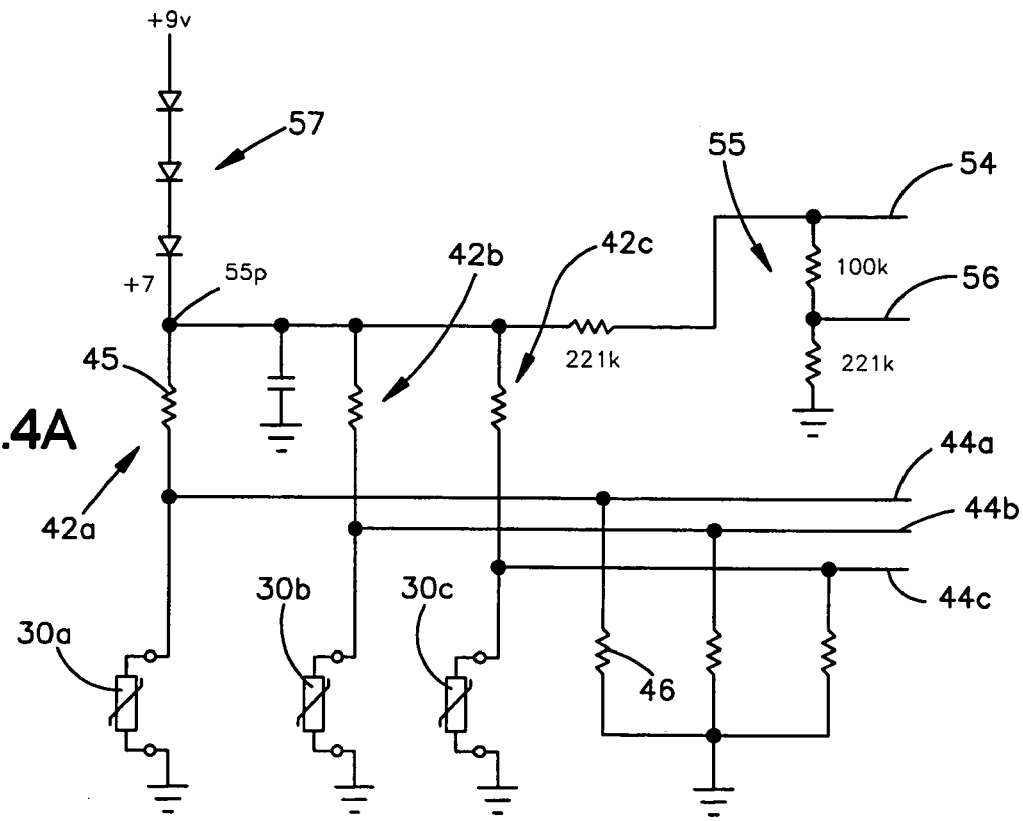
FIGS. 4A-4C depict an exemplary circuit for use with the invention.
Figure 4B:
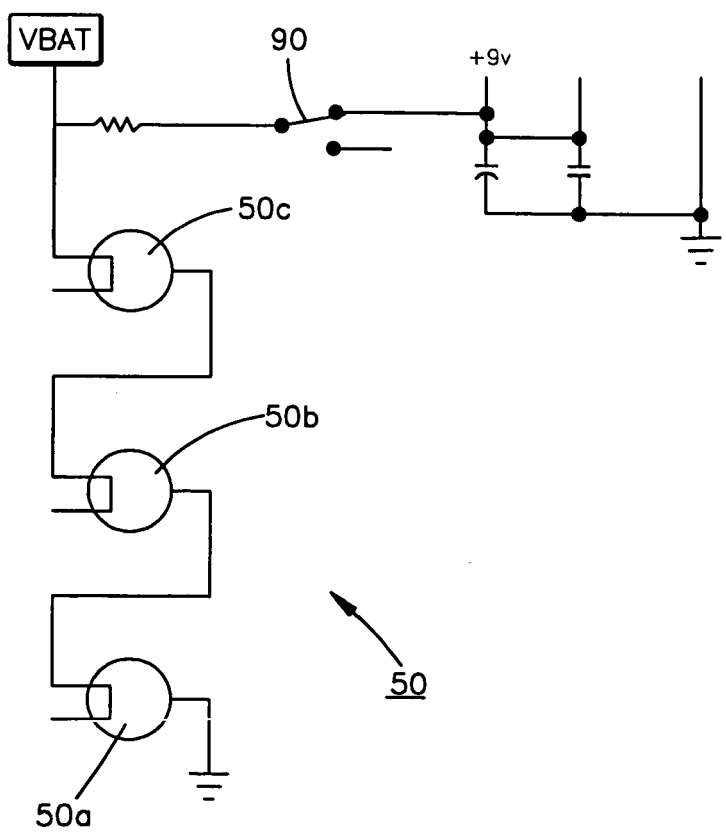
Figure 4C:
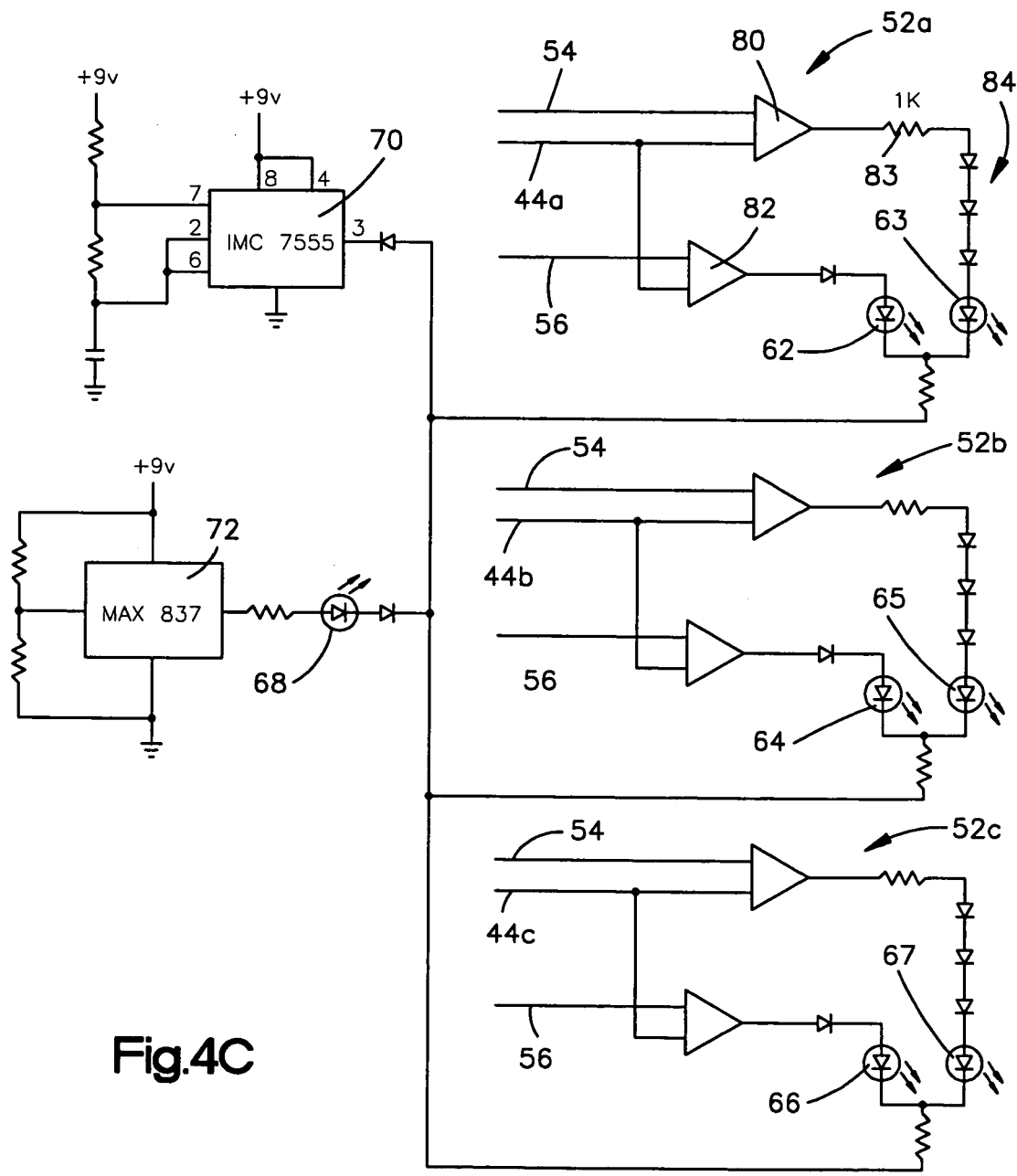

The exemplary system is implemented with multiple pressure sensors 30a, 30b, 30c whose resistance varies in a predictable way based on the force exerted against the sensor. Since the present instance the area of the sensors coming in contact with the wafer handling and support equipment is constant it is also appropriate to refer to the sensing of pressure against the sensor. Other suitable sensors could sense a voltage, a capacitance, or a frequency so long as the sensed parameter varied as a function of wafer simulator alignment. With no pressure, the resistance of a sensor is essentially infinite so that the sensor mimics an open circuit within the circuit 40. Referring to the schematics of FIGS. 4A, 4B, and 4C, the circuit 40 includes three divider circuits 42a, 42b, 42c coupled to the three sensors 30a, 30b, 30c that produce output signals at outputs 44a, 44b, 44c related to the pressure on the associated sensor. Consider the divider circuit 42a. This circuit includes two resistors 45, 46 having values of 274 Kohm and 1 Megohm respectively coupled to the nine volt output from the battery 50. The sensor 30a is coupled in parallel with the one Megohm resistor 46. With no pressure on the sensor 30a, its resistance is high and the voltage drop across the resistor 46 is a maximum of about 5.5 volts. As a pressure is exerted on the sensor 30a its resistance lowers thereby draining away some of the current from the resistor 46. This lowers the output signal at the output 44a.

The circuit 40 also includes three comparator circuit 52a, 52b, 52c (FIG. 4C) coupled to the outputs 44a, 44b, 44c from the voltage dividers for comparing the output signal to a threshold and producing a visible indication based on said comparison. The circuit 40 sets upper and lower threshold signals 54, 56 which define pressure ranges. The upper and lower threshold signals are defined by a voltage divider 55. The threshold setting voltage divider 55 is coupled to the nine volt battery output through a series of three diodes 57. As the battery voltage changes the high and low voltage threshold signals 54, 56 change in proportion to the voltage applied to the sensor and its voltage divider. This assures operation of the circuit 40 in sensing pressure by the three sensors 30a, 30b, 30c is not affected by the battery voltage.

Assuming a voltage of nine volts, the voltage drop through the conducting diodes 57 is approximately two volts so that a voltage at the positive junction 55p of the voltage divider 55 is seven volts. Based on the resistances shown in FIG. 4A, this results in a higher threshold of approximately 4.1 volts and a lower threshold of approximately 2.8 volts.

Figure 2A:
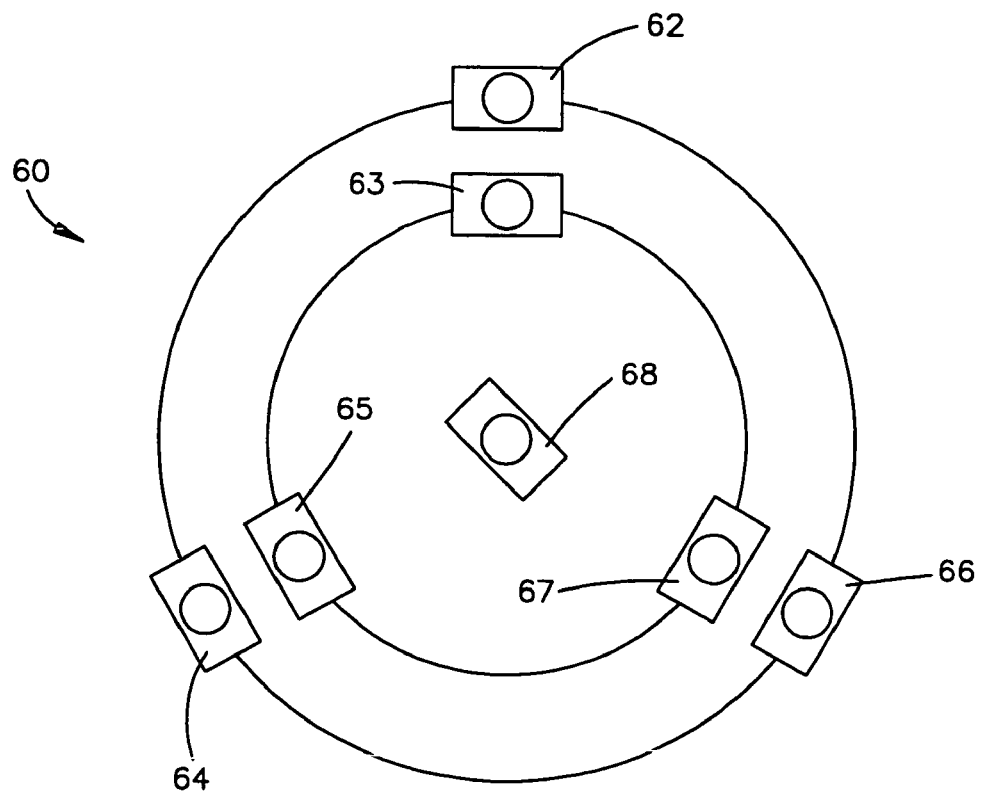
FIG. 2A is an indicator portion of the circuit board.

The circuit comprises multiple light emitting indicators 62-67 (FIG. 2A) corresponding to the ranges. In the exemplary embodiment, the indicators are more preferably light emitting diodes. When sufficient current is applied through the diodes, they emit light. In the exemplary system the diodes are coupled to a timer circuit 70 that produces a blinking or on/off signal having a frequency of approximately 20 hertz with a 10% on duty cycle.

Consider the comparator circuit 52a having two voltage comparators 80, 82 coupled to the threshold signals 54, 56 as well as the output signal 44a from the sensor 30a. A first voltage comparator produces a high output signal (+9 volts) when the threshold 54 (at its non-inverting input) exceeds the pressure output signal 44a (at its inverting input). With a threshold of 4.1 volts for the signal 54, and no pressure on the sensor 30a, the signal 44a is about 5.5 volts so the output from the voltage comparator is low. This means the diode 63 is non-conducting and therefore does not emit light. As the pressure on the sensor 30 increases the voltage of the signal 44a decreases until the threshold 54 exceeds the input 44a and the output from the voltage comparator goes high and the diode 63 conducts and emits lights.

As the pressure increases even further, the signal 44a falls below the lower threshold signal 56 of 2.8 volts. This sensed pressure produces a high output from the second voltage comparator 82 and renders a second diode 62 conductive and that diode emits light. Note, there is a combination of a resistor 83 and a series of three diodes 84 between the output of the first voltage comparator 80 and the diode 63. This difference between the outputs from the two voltage comparators allows the diode 62 to emit light but the diode 63 to be extinquished when the outputs of both voltage comparators 80, 82 are high. Consider the voltage at the cathode of the diode 62. The voltage at the output from the voltage comparator 82 is nine volts. The voltage at the cathode of the diode 62 is about 6.5 volts. This voltage drop across the combination of the resistor 83, series of diodes 84 and light emitting diode 63 limits the current through the diode 63 to about 0.1 milliamp, a current insufficient to produce useful visible light.

Table 1 below indicates the conductive state and characteristics of the diode illumination for a sensor for different forces on the sensor. Since the sensor pads are of uniform area, pressure and force are equivalent for the disclosed exemplary embodiment.

TABLE 1

| Pressure on sensor | Yellow led 63 | Red led 62 |
| --- | --- | --- |
| None | Dark | Dark |
| Greater than .02 lb of force and less than .15 lb of force | Light emitting | Dark |
| Greater than .15 lb force | Dark | Light emitting |

As noted above, the circuit 40 includes a battery 50 which in the preferred embodiment is three series connected 3.6 volt watch batteries 50a, 50b, 50c. At a peak output the three series batteries provide 3(3.6) or 10.8 volts but the value of +9 volts has been used herein to describe the battery voltage used to operate the circuit. A switch 90 coupled to the positive end of these series of batteries 50a, 50b, 50c is closed to couple a nine volt circuit board power signal to a voltage monitor circuit 72. Other nine volt connections are indicated in the schematics of FIG. 4. The monitor circuit 72 outputs a signal to a light emitting diode 68 located at the center of the array 60. So long as the nine volt signals is coupled to the monitor circuit by closing the switch 90, this led 68 is illuminated with the 20 hertz signal.

As noted above, the exemplary embodiment has three pressure sensors for monitoring alignment of the substrate that are mounted near an outer periphery of the test wafer 30. Turning to FIGS. 3A-3D, an exemplary version of the wafer simulator 30 has a radially inner ring 110 that bounds an opening 112 extending through the wafer simulator 30. This inner ring is conventional printed circuit board material (for example tin-plated copper clad epoxy-fiberglass laminate) having a thickness of approximately 0.06 inches. The outer perimeter of the circuit board material is attached to a carbon fiber annulus 114 that is slightly thinner than the circuit board material. The three sensors 30a, 30b, 30c are attached to the carbon fiber annulus with an adhesive (or alternately with a suitable clip) that limits outgassing of contaminants within the evacuated treatment chamber 12. The circuit board has a machined step or recess that extends part way through the circuit board. The diameter of this step is such that the inner diameter of the carbon fiber annuls butts against the outer diameter of the step and assures that a surface 30s that supports the sensors 30a, 30b, 30c is uniform from the outer diameter of the simulator to a inner radius of the ring 110.

Three strips of circuit board material 116 extend from the inner ring 110 made up of the circuit board material to the outer sensors 30a, 30b, 30c. These three strips attach or connect the inner ring 110 to the outer annulus 114. This three point flexible connection between the ring and annulus avoids distortion of the annulus with bending or flexing of the circuit board ring 110. Conductors that couple the sensors with the circuit components on the inner ring 110 also extend along these three elongated fingers. The sensors includes pressure sensitive pads 9.5 mm in diameter having a thickness of 0.43 mm. The thickness of the sensor pads 30a, 30b, 30c is sufficient to ensure the pads extend upward above a generally planar surface of the carbon fiber substrate so that the wafer handling and support equipment in the chamber contacts the sensors before the carbon fiber and therefore gives an accurate pressure reading. The entire weight of the simulator disk 30 and the circuit 40 is approximately 143 grams, compared to a silicon wafer which has an approximate weight of 127 grams.

The area in the center of the ring 110 that supports the circuit is open and reduces the overally weight of the simulator. It can be covered, however, if appropriate. As one example, this center portion of the wafer simulator 130 is covered with a transparent layer to which concentric circles that form a target are attached. Such a series of concentric circles could be used as an example to visually detect a misalignment of the simulator 30 with respect to wafer handling and support structure.

During movement of the wafers W through the ion implantation chamber depicted in schematic manner in FIG. 1A, the wafers come in contact with different support and movement implementing structure which gently delivers, rotates, reorients and generally repositions the wafers as they are automatically implanted or processed by a ion beam. Although the wafers are described in FIG. 1A in relation to a wafer implanter a variety of other treatment or processing steps could be performed on the wafers at other processing stations and indeed the invention can be used for simulating other workpieces that are moved in an automate process in which alignment and transfer processes are important.

It should be appreciated therefore that while the present invention has been described with a degree of particularity, it is the intent that the invention include all modifications and alterations from the disclosed design falling within the spirit or scope of the appended claims.

The invention claimed is:

1. Apparatus for calibrating workpiece handling equipment for use with a workpiece treatment system comprising:
   a) a support that supports a workpiece in a treatment region during workpiece processing;
   b) a housing that provides a controlled environment within a housing interior for processing one or more workpieces on the support;
   c) transfer structure for moving a workpiece into and out of said housing; and d) an alignment sensor for monitoring the workpieces within the housing and determining proper alignment of at least one of said workpiece support and transfer structure comprising a substrate having dimensions that approximate workpieces for movement into and out of said housing and a contact sensor mounted to the substrate for monitoring contact between the substrate and workpiece handling or support structure.

2. The apparatus of claim 1 wherein the substrate comprises:
   a sensing circuit for sensing an output from the sensor;
   a voltage source for energizing the circuit as the substrate is moved and positioned;
   an indicator for providing an output regarding the sensed alignment of said substrate.

3. The apparatus of claim 2 wherein the indicator is a visual indicator.

4. The apparatus of claim 2 wherein the indicator provides a wireless communications signal for indicating the sensed alignment.

5. The apparatus of claim 2 comprising multiple contact sensors having a resistance that varies based on a force or pressure and wherein the sensing circuit comprises multiple circuits, each including an associated sensor to produce an output signal related to the force or pressure on the associated sensor and a comparator circuit coupled to the output signal for comparing the output signal to a threshold and producing an indication based on said comparison.

6. The apparatus of claim 5 wherein the comparator circuit sets upper and lower thresholds to produce pressure ranges and wherein the circuit comprises multiple light emitting indicators corresponding to the ranges.

7. The apparatus of claim 6 wherein the sensing circuit comprises a threshold voltage divider for producing high and low voltage thresholds for use by the comparator circuit in establishing the ranges.

8. The apparatus of claim 7 wherein the threshold voltage divider is coupled to the battery and said high and low voltage thresholds change with changes in battery voltage.

9. The apparatus of claim 4 wherein the indicator has an on/off duty cycle to improve visibility and reduce power consumption.

10. The apparatus of claim 2 wherein the substrate includes multiple pressure sensors for monitoring alignment of the substrate.

11. The apparatus of claim 1 wherein the sensor includes pressure sensitive pads that are contacted by the transfer and support structure.

12. The apparatus of claim 1 wherein the housing includes a transparent window for monitoring a visual output from said sensor.

13. A process for calibrating workpiece handling equipment for use with a wafer treatment system comprising:
   a) providing a support within a housing that provides a controlled environment for processing of workpieces;
   b) moving a workpiece into and out of the housing to and from a support;
   c) mounting a pressure sensor to the workpiece for monitoring contact of the workpiece with workpiece handling or support structure;
   d) monitoring alignment of the workpiece as it is moving to and from the support by monitoring an output from the pressure sensor; and
   e) providing an indication of said workpiece alignment.

14. The process of claim 13 comprising providing a visual output regarding the sensed alignment of said workpiece.

15. The process of claim 13 comprising mounting multiple pressure sensors having a resistance that varies based on the pressure at spaced locations around a periphery of said workpiece.

16. The process of claim 15 comprising producing an output signal related to the pressure on an associated sensor and comparing the output signal to a threshold and producing a visible indication based on said comparison.

17. The process of claim 16 comprising setting upper and lower thresholds to produce pressure ranges and wherein the an output circuit comprises multiple light emitting indicators which are activated based on the pressure readings from the sensors.

18. The process of claim 13 wherein the indication is provided by activating a visual indicator with an on/off duty cycle.

19. The process of claim 18 comprising providing a transparent window for monitoring an output from said visual indicator.

20. Apparatus for calibrating wafer handling equipment for use with a wafer treatment system comprising:
   a) a housing that provides a controlled environment within a housing interior for processing one or more wafers;
   b) a wafer support that supports a wafer in a treatment region during wafer processing;
   c) transfer structure for moving a wafer into and out of said housing; and
   d) a wafer simulator for monitoring set up of the transfer structure comprising a substrate having a pressure sensor for monitoring contact between the substrate and the transfer structure for providing an output as the substrate is transferred by the transfer structure during calibration of the wafer handling equipment.

21. For use with semiconductor wafer processing apparatus a wafer simulator comprising:
   a) a generally planar substrate including one or more pressure sensors mounted on one side of said substrate;
   b) circuitry electrically coupled to the one or more pressure sensors for monitoring signals from said one or more pressure sensors; and
   c) visual indicators coupled to said circuitry for providing an output indication based on the pressure exerted against said one or more pressure sensors during movement and positioning of the wafer simulator.

22. The apparatus of claim 21 comprising a voltage source mounted to the substrate and multiple pressure sensors having a resistance that varies based on a force or pressure and wherein the circuitry comprises a divider circuit including an associated pressure sensor to produce an output signal related to the force or pressure on the associated pressure sensor and a comparator circuit coupled to the output signal for comparing the output signal to a threshold and producing a visible indication from an associated visual indicator based on said comparison.

23. The apparatus of claim 22 wherein the comparator circuit sets upper and lower thresholds to produce pressure ranges and wherein the circuit comprises multiple light emitting indicators for indicating sensed pressure.

24. The apparatus of claim 23 wherein the sensing circuit comprises a threshold voltage divider for producing high and low voltage thresholds for use by the comparator circuit in establishing the ranges.

25. The apparatus of claim 24 wherein the threshold voltage divider is coupled to the battery and said high and low voltage thresholds change with changes in voltage of the voltage source.

26. The apparatus of claim 21 wherein the indicator has an on/off duty cycle to improve visibility and conserve power.

27. The apparatus of claim 21 wherein the substrate includes multiple pressure sensors for monitoring alignment of the substrate.

28. The apparatus of claim 21 wherein each of said pressure sensors includes a pressure sensitive pad that is contacted as the wafer simulator is moved and positioned.

29. The apparatus of claim 21 wherein the substrate is generally circular in plan and wherein there are three pressure transducers generally equally spaced near an outer periphery of said substrate.

* * * * *